United States Patent [19]
Val et al.

[11] Patent Number: 5,640,760
[45] Date of Patent: Jun. 24, 1997

[54] METHOD FOR THE 3D INTERCONNECTION OF PACKAGES OF ELECTRONIC COMPONENTS USING PRINTED CIRCUIT BOARDS

[75] Inventors: Christian Val, St Remy les Chevreuse; André Gerard, Viroflay, both of France

[73] Assignee: Thomson-CSF, Paris, France

[21] Appl. No.: 437,797

[22] Filed: May 9, 1995

[30] Foreign Application Priority Data

May 10, 1994 [FR] France ................... 94 05729

[51] Int. Cl.⁶ ............... H05K 3/28; H05K 3/30; H05K 3/36
[52] U.S. Cl. ............. 29/830; 29/417; 29/831; 29/841; 216/65; 264/272.14
[58] Field of Search ............. 29/25.35, 25.41, 29/25.42, 411, 417, 830, 831, 841; 264/272.11, 272.14, 272.17; 216/13, 20, 65; 174/52.4; 361/763, 764

[56] References Cited

U.S. PATENT DOCUMENTS

| | | | |
|---|---|---|---|
| 3,029,495 | 4/1962 | Doctor | 29/830 |
| 4,408,256 | 10/1983 | Val | 361/767 |
| 4,413,170 | 11/1983 | Val et al. . | |
| 4,518,818 | 5/1985 | Le Ny et al. | 174/52.4 |
| 4,546,028 | 10/1985 | Val | 361/706 X |
| 4,553,020 | 11/1985 | Val | 257/682 X |
| 4,559,579 | 12/1985 | Val | 257/355 X |
| 4,635,356 | 1/1987 | Ohuchi et al. | 29/841 |
| 4,639,826 | 1/1987 | Val et al. | 174/52.4 X |
| 4,654,694 | 3/1987 | Val | 361/763 X |
| 4,755,910 | 7/1988 | Val | 361/763 |
| 4,890,383 | 1/1990 | Lumbard et al. | 29/841 |
| 5,002,895 | 3/1991 | LeParquier et al. | 257/666 X |
| 5,107,586 | 4/1992 | Eichelberger et al. | 29/830 |
| 5,237,204 | 8/1993 | Val | 257/698 |
| 5,317,792 | 6/1994 | Tanaka | 29/411 X |
| 5,323,533 | 6/1994 | Val | 29/840 |
| 5,400,218 | 3/1995 | Val | 257/666 X |
| 5,414,917 | 5/1995 | Tanaka | 29/25.35 |
| 5,440,794 | 8/1995 | Kaeriyama et al. | 29/25.42 |

FOREIGN PATENT DOCUMENTS

| | | |
|---|---|---|
| 0 354 708 | 2/1990 | European Pat. Off. . |
| 0 434 543 A2 | 6/1991 | European Pat. Off. . |
| 0 565 391 A1 | 10/1993 | European Pat. Off. . |
| 0 593 330 A1 | 4/1994 | European Pat. Off. . |
| 2688630 | 9/1993 | France . |
| WO88/08203 | 10/1988 | WIPO . |

*Primary Examiner*—Peter Vo
*Attorney, Agent, or Firm*—Oblon, Spivak, McClelland, Maier & Neustadt, P.C.

[57] ABSTRACT

In a method for the interconnection of stacked packages, each of the packages encapsulating, for example, a semiconductor chip containing an integrated circuit, a memory for example, the packages provided with pins are mounted on a printed circuit board. The printed circuit boards are stacked and fixedly joined with one another by means of a coating, for example a resin coating. The stack is sliced through so as to form bars, the pins of the packages being electrically connected to the side surfaces of the bars by means of the tracks of the printed circuit boards. The connection of the packages to one another is done on the side faces of the bars. The bars are then sliced through to obtain unit blocks of stacked packages.

13 Claims, 6 Drawing Sheets

METHOD FOR THE 3D INTERCONNECTION OF PACKAGES OF ELECTRONIC COMPONENTS USING PRINTED CIRCUIT BOARDS

BACKGROUND OF THE INVENTION

1. Field of the Invention

An object of the present invention is a method for the 3D interconnection of packages mounted on printed circuit board (PCB) type substrates, each of the packages encapsulating a discrete, passive or active or integrated electronic component that is a semiconductor chip, containing for example an integrated circuit or one or more sensors. These components are hereinafter, without distinction, called components or chips. An object of the invention is also a 3D component resulting therefrom.

The making of current electronic systems, for both civilian and military purposes, must take account of increasingly stringent requirements as regards compactness owing to the increasingly large number of circuits put into operation.

2. Description of the Prior Art

Thus, the French patent application No. 2 688 630 filed on behalf of THOMSON-CSF has already proposed the making of stacks of packages containing integrated circuits. The packages, provided with connection pins, are stacked and then joined together by coating with an insulator material, for example, a resin. Then, the stack is sliced or partitioned at the level of the pins of the packages, and connections between the pins which are flush with the surface are made on the faces of the stack.

SUMMARY OF THE INVENTION

An object of the invention is the making of stacks of the same type but according to a method of manufacture entailing greater batch manufacture in order to reduce the costs thereof.

To this end, the packages of components are positioned, for example, in m rows and n columns on an insulator substrate, for example of the PCB type, on one or both faces of this substrate. The connection regions of the packages are connected to tracks of the PCB, the tracks extending up to axes along which subsequent slicing operations will be carried out. A plurality p of such PCBs fitted out with packages are then stacked and then embedded in an insulator such as a resin. The entire unit is then sliced or slotted along the above-mentioned axes to individualize bars along the rows or columns of packages. Then, the interconnections of the tracks flush with the lateral faces of the bars are made in batches by metallization and then etching for example. Finally, if necessary, the bars are cut through to form unit blocks comprising p or 2p stacked and interconnected packages.

BRIEF DESCRIPTION OF THE DRAWINGS

Other objects, features and results of the invention shall emerge from the following description, given by way of an example and illustrated by the appended drawings, of which:

FIG. 2c shows a sectional view of FIG. 2a;

In these different figures, the same references relate to the same elements. Furthermore, for the clarity of the drawings, they have not been drawn to scale.

MORE DETAILED DESCRIPTION

Figure 1:
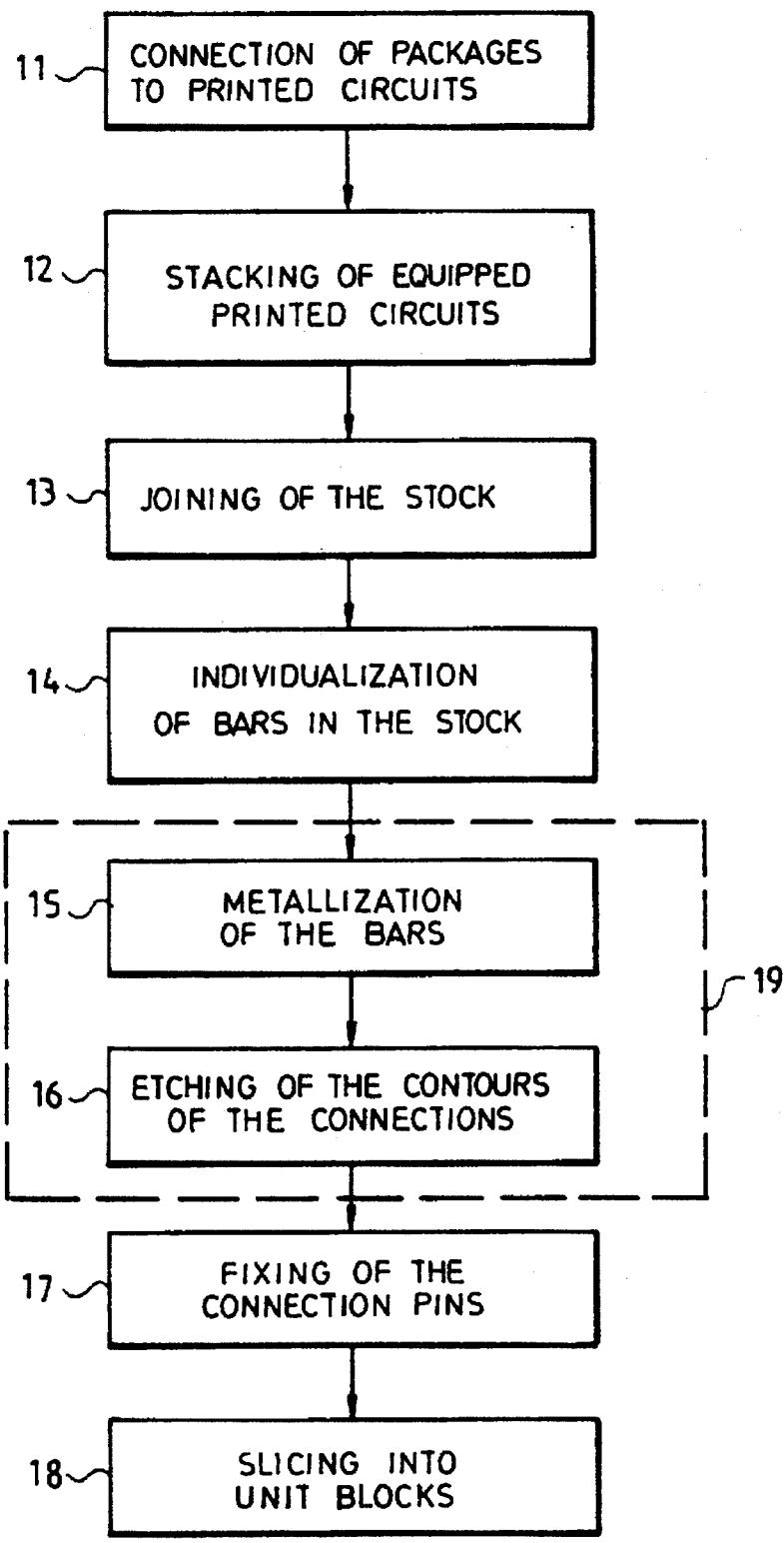
FIG. 1 shows a mode of carrying out the method according to the invention.

FIG. 1 therefore illustrates an embodiment of the method according to the invention.

The first step of the method, referenced 11, consists in positioning a number of packages on one or both faces of an electrically insulating substrate, for example of the PCB type. The package contains an electronic component, for example a semiconductor chip in which an integrated circuit is made. It is furthermore provided with connection regions, either pins or metallizations with or without bumps.

Figure 2A:
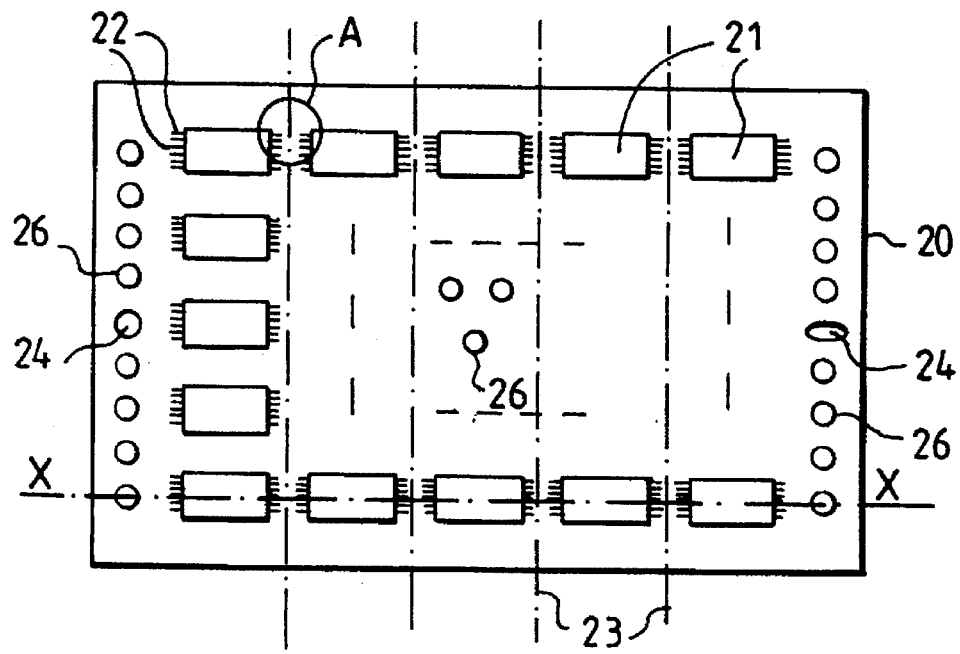
FIG. 2a shows a top view of the first step of the method of the above figure.

FIG. 2a shows a top view of such PCBs equipped with packages.

Figure 2B:
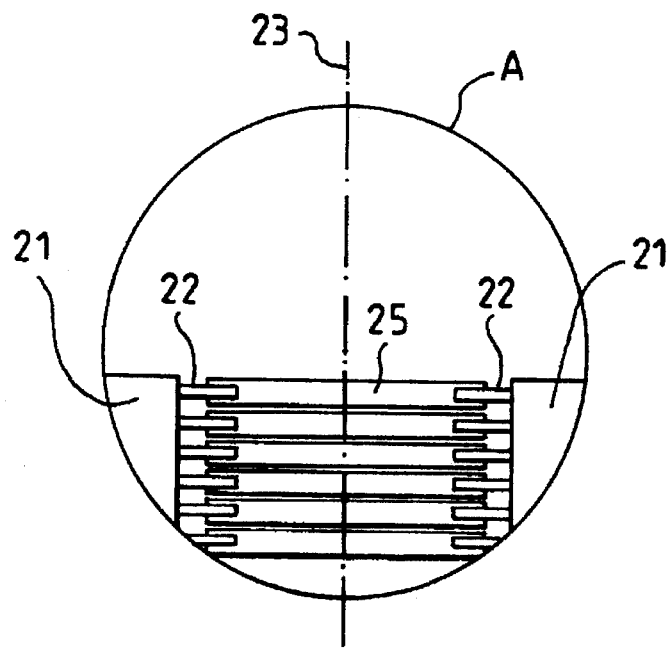
FIG. 2b shows an enlarged detailed view of the above figure.

This figure shows a substrate 20 of the PCB type bearing packages 21 arranged, for example, in m rows taken horizontally in the figure and n columns taken vertically. The packages 21 are, for example, provided with connection pins 22 which are electrically connected to conductive tracks borne by the PCBs 20 as shown in a detailed view in FIG. 2b which shows an enlarged view of the part A of FIG. 2a.

The pins 22 of the packages are connected to tracks 25 which are drawn so as to set up an electrical connection between the pins 22 and a slicing plane represented by an axis 23 along which the PCB 20 will be subsequently cut out. In the figure, the tracks 25 have been shown as being straight but they may take another shape, for example they could be arranged as in a fan to provide for greater distance between the tracks at the slicing axis 23.

Figure 2C:
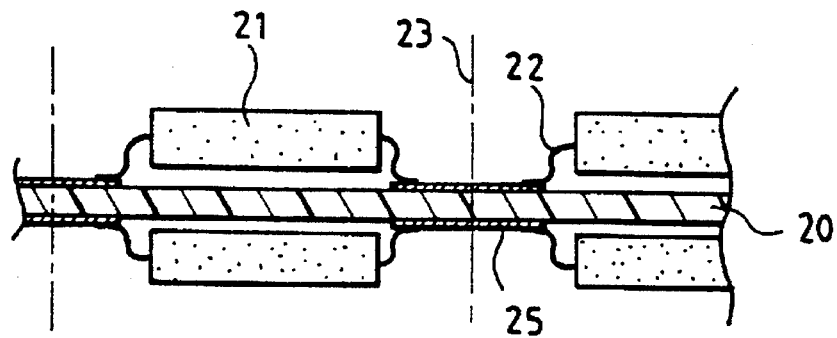

FIG. 2c shows a sectional view of FIG. 2a along an axis XX going through the packages 21 of one and the same row.

FIG. 2c again shows the PCB 20 bearing packages 21, for example on both its faces, the pins 22 of these packages being connected to the slicing planes 23 by means of the tracks 25.

The PCB 20 shown in FIG. 2a further has a certain number of spacers 26 whose role shall be seen hereinafter. These spacers may be, for example, small cylinders with a circular or rectangular base made of a metal such as copper or again they may be a PCB type substrate covered with copper. These spacers are, for example, brazed like the packages 21 to locations of the PCB 20 metallized beforehand for this purpose. They may also, like the packages 21, be bonded by means of an electrically conductive bonder.

Optionally, the brazing may be checked at this time, for example optically, and it may be repaired if necessary.

The next step (12, FIG. 1) consists in stacking the PCBs thus equipped with packages.

The different stacked PCBs are preferably equipped with packages positioned at the same place from one PCB to another and spacers also positioned at the same place. Preferably again, the spacers are positioned in regions that are not filled with packages, at the periphery of the PCBs and/or in one or more central regions set aside for this purpose. The spacers 26 are preferably slightly higher than the packages so as to make an inter-package space. The stack is made preferably by using alignment holes 24 positioned for example on the edges of the PCBs 20.

During the next step, referenced 13, the stack is joined together by the coating of the unit by means of an electrically insulator material such as a polymerizable resin, for example epoxy resin, which may be cast under vacuum.

Figure 3:
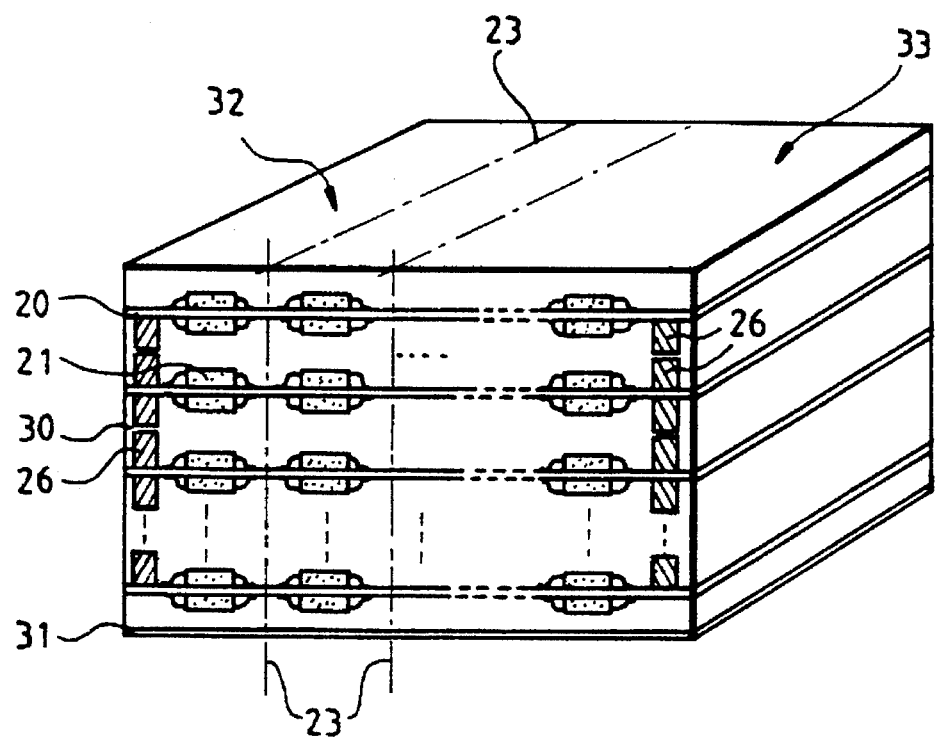
FIG. 3 shows an embodiment of the stack of equipped PCBs.

The result of the stacking is shown in FIG. 3, which is a view in perspective whose front face is a section, also made along the axis XX of FIG. 2a.

This FIG. 3 shows the stack 33 of a certain number p of PCBs 20 equipped with packages 21 and separated by spacers 26. The unit is embedded in a resin 30 which, although seen in a sectional view, has not been hatched for the clarity of the drawing. The fact that the height of the spacers 26 has been chosen to be greater than that of the packages 21 provides for efficient coating of the packages by the material 30.

In a preferred embodiment, one of the faces at least, for example the lower face, is terminated by a PCB type substrate 31 making it easier to route the connections.

The next step, referenced 14 in FIG. 1, consists in individualizing the bars in the stack thus obtained at the end of the foregoing steps and illustrated in FIG. 3.

According to a first embodiment, the stack is sliced through or partitioned along the slicing planes 23 in order to form bars 32. The slicing is done for example so as to separate each of the columns.

At the end of the slicing operation, the connection regions 22 of the packages 21 are connected to the side faces of the bars by means of the tracks 25.

The next step (19) consists in forming connections between the packages 21 on the side faces of the bars 32.

These connections may be formed, for example as illustrated in FIG. 1, by a first step 15 for the metallizing of all the bars or at least of their side faces followed by a second step 16 for the etching of the contours of the connections. The metallization may be done by chemical means (nickel plus copper plus gold) or electrochemical means. The etching may be done by means of a laser. The steps are shown in FIGS. 4, 5a and 5b.

Figure 4:
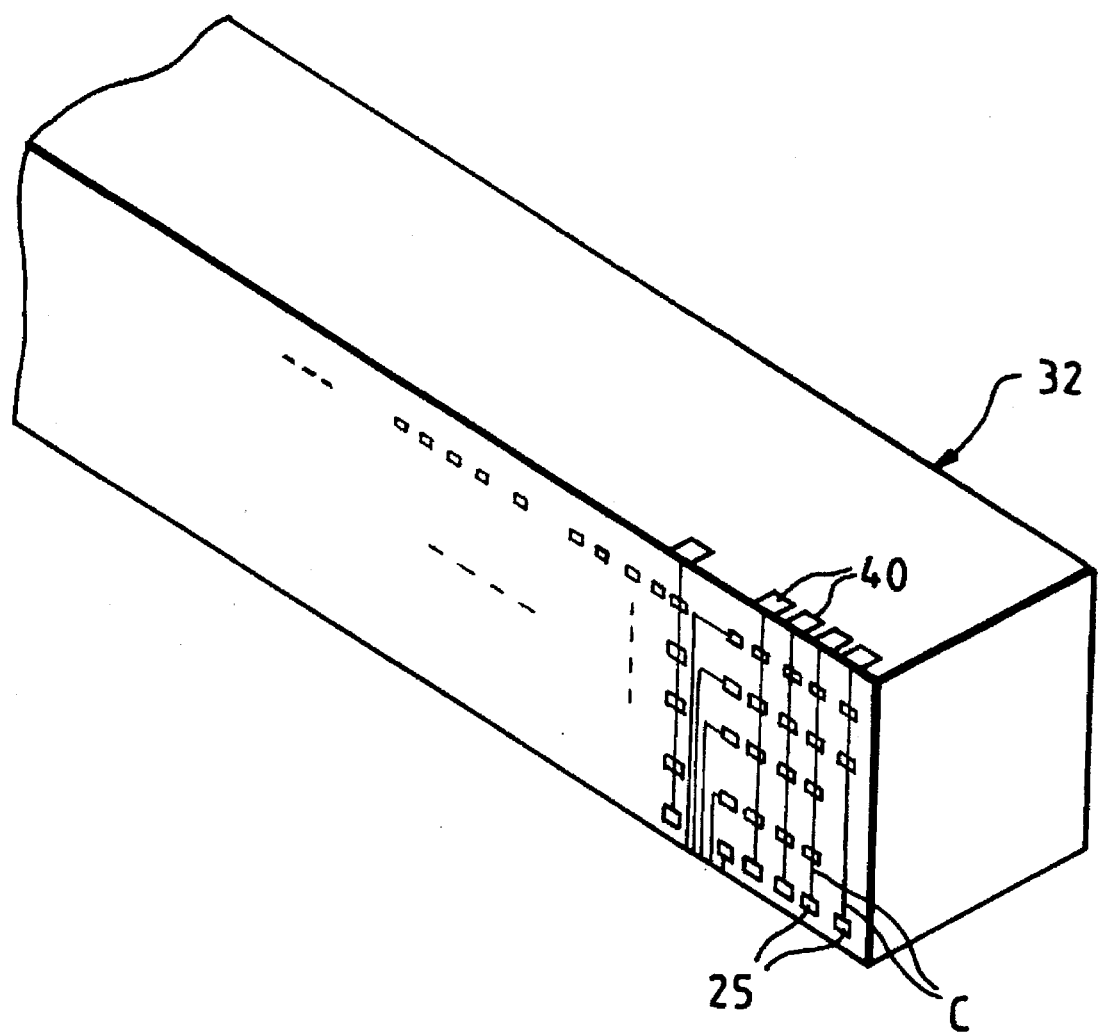
FIG. 4 shows an embodiment of the interconnections of the tracks on the lateral faces of the bars obtained during the method according to the invention.
Figure 5A:
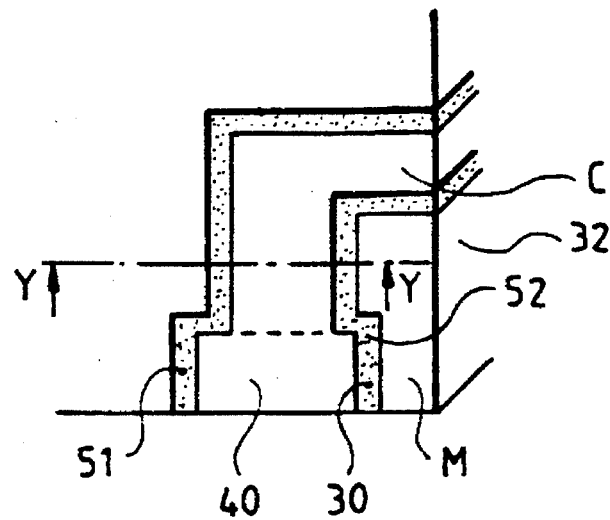
FIGS. 5a and 5b show a practical embodiment of these connections.
Figure 5B:
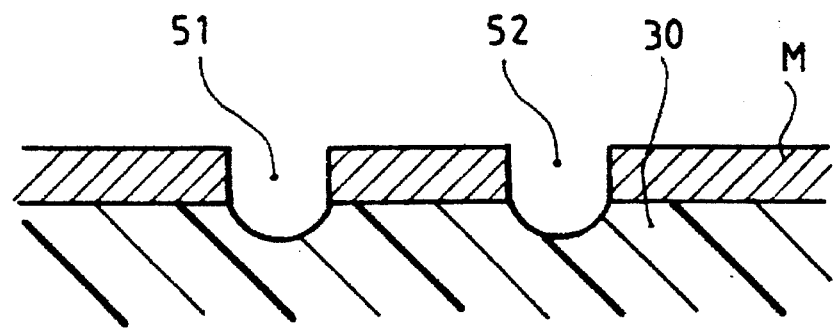

FIG. 4 shows a fractional view of a bar on which exemplary connections are shown.

This FIG. 4 shows the tracks 25 connected to the connections 22 flush with the side faces of the bar 32. The bar 32 has pads 40, called stack pads, on one or more of its faces. These pads 40 are intended for the electrical connection of the bar with external circuits. The connections 25 are both interconnected to one another and, when necessary, connected to the stack pads 40 by means of connections C.

By way of an example, the figure shows the case where the packages contain memories. In this case, all their homologous pins are connected to one another and to a stack pad 40 except one for each of the packages that corresponds to the selection input of the memory. These selection pins are then individually connected, for example by means of the closing PCB located beneath the stack, to distinct stack pads which are not visible in the figure.

FIGS. 5a and 5b give a more detailed view of an embodiment of the connections C.

FIG. 5a shows a fractional view of a piece of a bar 32 where there is a connection C and a stack pad 40. FIG. 5b is a sectional view along the axis YY of FIG. 5a.

Each of the connections C is formed by two etchings 51 and 52, formed for example by means of a laser that locally destroys the conductive layer referenced M and reveals the insulating coating material 30. This material 30 has been shown in dashes in FIG. 5a for the clarity of the drawing. In this way, the electrical insulation of the connection C from the rest of the layer M is made. The stack pads 40 may advantageously be made by the same technique of the laser etching, as shown in FIG. 5a.

The next step, referenced 17 in FIG. 1, is optional and consists in fixing connection pins on the previous bar enabling its connection with external circuits.

Finally, the last step (18) consists in slicing the above bar into unit blocks, each of the blocks being then formed by p stacked packages if the support 20 is a single-face support or 2p packages if it is a dual-face support.

The last step is an optional one. Indeed, it may be advantageous, in certain applications, to have only one component available with m x p or m x 2p packages, these packages being furthermore interconnected during the step 19 and/or by means of the closing PCB or PCBs.

Figure 6:
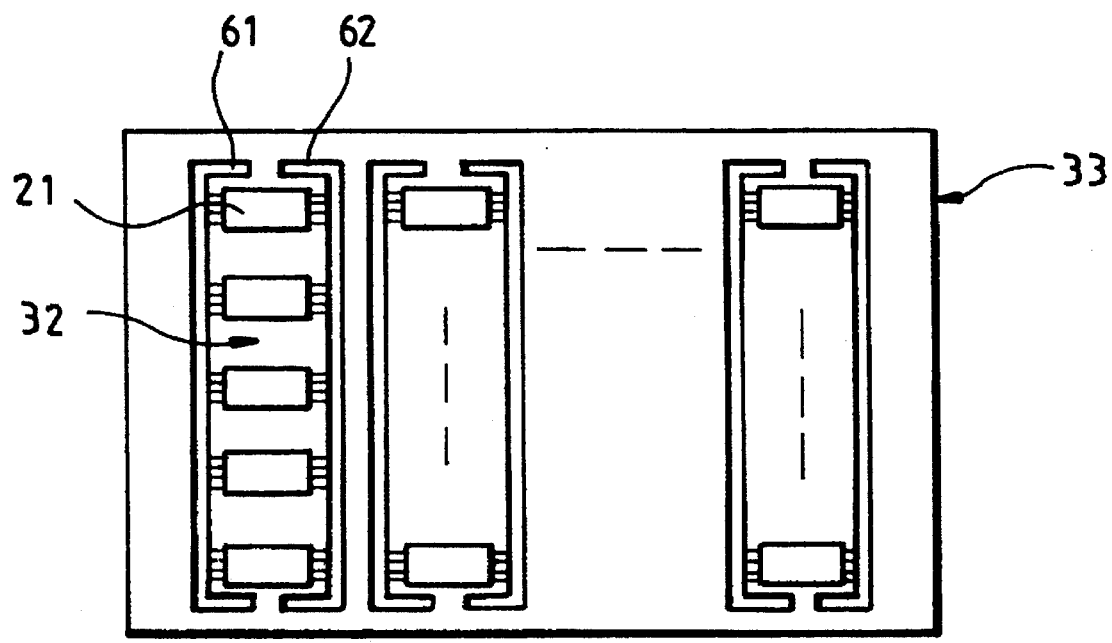
FIG. 6 shows an alternative embodiment of the step for the individualization of the bars.

FIG. 6 shows an alternative to the step 14 for individualizing the bars that consists no longer in slicing them but in slotting them.

In FIG. 6, the stack 33 is shown in a top view. In order to individualize the bars 32, two non-contiguous slots 61 and 62 are made around each of them, so that the bar continues to be fixedly joined to the stack 33. The slots are made as the slicing operations here above so as to cause the connections 25 to be flush with the side faces, these connections 25 being themselves connected to the pins 22 of the packages 21.

All the subsequent steps are unchanged except that they involve even greater batches owing to the fact that all the bars of the stack 33 may be processed at the same time since they remain joined with each other.

A method has been described here above for the 3D interconnection of the packages, enabling the performance of the operations for the forming of the interconnections (C) and, if necessary, for fixing connection pins in batches for a set of blocks (m or n or m x n) and, by this very fact, for doing so more economically. Furthermore, since the blocks are joined to one another within a bar, no operation for positioning the blocks with respect to one another is required.

The above description has been given by way of an example and other variants are possible. Thus, for example, the PCBs 20 may each carry only one row (or only one column) of packages 21. Again, the PCBs 20 may carry metallizations (not shown) forming heat sinks opening on to one of the faces of the blocks (preferably, one face having no connection C).

What is claimed is:

1. A method for the 3D interconnection of a plurality of packages, each of said packages including at least one electronic component and connection regions, said method comprising the steps of:

connecting said connection regions to conductive tracks on electrically insulating substrates, said conductive tracks extending up to slicing axes;

stacking the electrically insulating substrates into a stack;

joining together the electronically insulating substrates by embedding the electrically insulating substrates in an electrical insulator material;

slicing the stack along the slicing axes to obtain individualized bars, the electrically insulating substrates of each individualized bar bearing a plurality of packages; and forming a 3D interconnection of the plurality of packages on each individualized bar by forming electrical connections between said conductive tracks on faces of said individualized bars.

2. The method according to claim 1, wherein said electrical insulator material is a polymerizable resin.

3. The method according to claim 1, wherein the forming step comprises the sub-steps of:

depositing a conductive layer on all the faces of the stack; and etching said conductive layer to form the electrical connections which link said conductive tracks to one another.

4. The method according to claim 3, wherein the etching sub-step is carried out by etching with a laser.

5. The method according to claim 1, wherein the step of forming electrical connections, further comprises the step of forming stack pads designed for connecting the stack with external circuits, said electrical connections linking at least pins and certain of the stack pads with one another.

6. The method according to claim 1, further comprising, after the step of forming a 3D interconnection by forming electrical connections between said conductive tracks, a step of slicing said individualized bars perpendicular to the slicing axes to form plural unit blocks, the substrates of each of the plural unit blocks bearing only one package.

7. The method according to claim 1, wherein the connection regions of the packages are one of pins and metallizations.

8. The method according to claim 1, further comprising, after the step of forming a 3D interconnection by forming electrical connections between said conductive tracks, a step of slicing said individualized bars perpendicular to the slicing axes to form plural unit blocks, the substrates of each of the plural unit blocks bearing only one package.

9. A method for the 3D interconnection of a plurality of packages, each of said packages including at least one electronic component and connection regions, said method comprising the steps of:

connecting said connection regions to conductive tracks on electrically insulating substrates, said conductive tracks extending up to slicing axes;

stacking the electrically insulating substrates into a stack;

joining together the electronically insulating substrates by embedding the electrically insulating substrates in an electrical insulator material;

slicing the stack along the slicing axes to obtain individualized bars, the electrically insulating substrates of each individualized bar bearing a plurality of packages; and forming a 3D interconnection of the plurality of packages on each individualized bar by forming electrical connections between said conductive tracks on faces of said individualized bars, wherein the step of forming comprises the sub-steps of:

depositing a conductive layer on all the faces of the stack; and etching said conductive layer to form the electrical connections which link said conductive tracks.

10. The method according to claim 9, wherein said electrical insulator material is a polymerizable resin.

11. The method according to claim 9, wherein the etching sub-step is carried out by etching with a laser.

12. The method according to claim 9, wherein the step of forming electrical connections, further comprises the step of forming stack pads designed for connecting the stack with external circuits, said electrical connections linking at least pins and certain of the stack pads with one another.

13. The method according to claim 9, wherein the connection regions of the packages are one of pins and metallizations.

* * * * *